United States Patent [19]

Su

[11] 4,099,317
[45] Jul. 11, 1978

[54] METHOD FOR FABRICATING SELF-ALIGNED CCD DEVICES AND THEIR OUTPUT SELF-ALIGNED MOS TRANSISTORS ON A SINGLE SEMICONDUCTOR SUBSTRATE

[75] Inventor: Stephen C. Su, Huntington Beach, Calif.

[73] Assignee: Hughes Aircraft Company, Culver City, Calif.

[21] Appl. No.: 683,361

[22] Filed: May 5, 1976

[51] Int. Cl.² .............................................. B01J 17/00
[52] U.S. Cl. ......................................... 29/571; 29/578
[58] Field of Search ...................... 29/571, 578; 357/24

[56] References Cited

U.S. PATENT DOCUMENTS

| 3,967,306 | 6/1976 | Bower ..................................... 357/24 |
| 4,028,716 | 6/1977 | Gerrit van Santen et al. ........ 357/24 |

Primary Examiner—W. Tupman
Attorney, Agent, or Firm—George Tacticos; W. H. MacAllister

[57] ABSTRACT

The specification describes a self-aligning masking technique for the fabrication of charge coupled device-metal oxide semiconductor (CCD/MOS) transistor combinations. Both the CCD devices and the output MOS transistors are formed on the same semiconductor substrate during the same processing steps. Two layers of polycrystalline silicon, isolated from each other by a layer of dielectric material and isolated from the semiconductor substrate by another dielectric layer are used to form two sets of partially overlapping semiconductor strips. These strips and predetermined portions of the substrate are then doped, with a conductivity determining impurity opposite the conductivity type of the substrate. This process produces two self-aligned sets of gate electrodes for a two-phase or a four-phase CCD device and also produces two output self-aligned gate field effect transistors at the end of the CCD array.

12 Claims, 14 Drawing Figures

METHOD FOR FABRICATING SELF-ALIGNED CCD DEVICES AND THEIR OUTPUT SELF-ALIGNED MOS TRANSISTORS ON A SINGLE SEMICONDUCTOR SUBSTRATE

FIELD OF THE INVENTION

This invention relates generally to a self-aligned charge coupled device (CCD) and a process for making same. More specifically, it relates to a two-phase or four-phase self-aligned gate CCD and its output self-aligned gate field effect transistors. Both the CCD and the transistors are formed on the same semiconductor body during the same processing operations.

BACKGROUND

A charge coupled device is a semiconductor apparatus used for storing and sequentially transferring charges, representing information, between potential wells created adjacent the surface of the semiconductor body under a dielectric layer. These potential wells are induced by the sequential application of voltages to an array of conducting electrodes located on top of the dielectric layer adjacent the semiconductor body, and interconnected to establish a two-phase, three-phase or four-phase operation.

Two-phase CCD structures employing differential gate insulator thicknesses to produce a different interface potential for a given gate voltage are generally well known. These structures usually have overlapping electrodes isolated from each other by a dielectric material and are connected in pairs. Sometimes they also have ion implanted regions in the substrate which are self aligned with a first set of electrodes. The two sets of electrodes either partially overlap each other or have small interelectrode gaps. When they overlap, they produce a coupling capacitance, which permits the feedthrough of clock voltages and degrades the performance of the device, especially at high frequencies. When interelectrode gaps exist, the charge transfer efficiency of the device is degraded.

In addition, very often the frequency response of a CCD structure is limited by the response of its output MOS transistors.

PRIOR ART DEVICES

Early charge coupled semiconductor devices were disclosed, for example, in an article entitled "Charge Coupled Semiconductor Devices," B.S.T.J. April, 1970, pages 587–593 inclusive. The article discloses a structure comprising a semiconductor substrate, an insulating layer overlaying one of its surfaces and a plurality of metal electrodes disposed over the insulating layer. It is a three-phase device which moves packets of minority carriers along a region close to the semiconductor insulator interface by the sequential application of voltages to the three sets of electrodes. The voltages create potential wells of varying depth in which charges can be injected and stored until they are forced to spill over and be collected in an adjoining potential well, thus moving along in the desired direction. The third electrode is in effect a blocking electrode which prevents the charges from flowing back. The transfer of charges is not without loss, and much of the transfer inefficiency is due to the interelectrode distances. Thus, etching small gaps between the electrodes provides a considerable practical limitation to the operational efficiency of this structure. A diagrammatic cross-sectional view of such a structure is shown in FIG. 1, which is described in some detail at a later section of the specification.

U.S. Pat. No. 3,651,349 of D. Kahng et al. discloses a two-phase CCD cell. In this structure the need for a third electrode in every cell is eliminated by using two overlapping electrodes and non-uniform dielectric thicknesses to achieve an asymmetrical potential well necessary to enhance the transfer of charges in a predetermined direction and impede their flow in the opposite direction. A diagrammatic cross-sectional view of such a structure is shown in FIG. 2, which is also described in some detail at a later section of the specification.

A major limitation of this device is its high coupling capacitance caused by the overlapping of adjacent electrodes. This produces voltage spikes which permit the feedthrough of clock voltages. Also the gate electrode overlap makes possible the generation of electrical shorts when the quality of the insulating dielectric layer is poor.

THE INVENTION

The general purpose of this invention is to provide a new and improved CCD structure with two sets of self-aligned gate electrodes and an output self-aligned gate field effect transistor and the fabrication process therefor, having most if not all of the advantages and desirable features of similarly employed devices and related processes, while eliminating many of the aforementioned disadvantages of prior art structures.

To accomplish this purpose, I have provided a method of fabricating a semiconductor charge coupled device with an output transistor structure wherein initially a first layer of an electrically insulating material is formed on a surface of a semiconductor substrate having a first type of conductivity. A first layer of semiconductor material is then disposed over predetermined portions of the first layer of electrically insulating material. A second layer of electrically insulating material is formed over the first semiconductor layer and a second layer of a semiconductor material is disposed over selective predetermined portions of the second insulating layer. The exposed portions of the electrically insulating material are removed and a conductivity determining impurity is diffused into the exposed semiconductor material, and the exposed portions of the semiconductor substrate, using the first and second semiconductor layers as diffusion masks. This impurity is capable of forming a second type of conductivity in the substrate material into which it diffuses and converts the first and second insulating semiconductor materials into conductors. A truly self-aligned CCD/MOS structure is achieved with this process. The two sets of electrodes are in perfect alignment with each other, thus assuring an optimum coupling of the potential wells and a minimum of coupling capacitance and noise. Similarly, in the output stage, the transistor gate is used as a diffusion mask for the formation of the source and drain regions. This improves the transconductance of the transistor and thus improves its high frequency characteristics. An added advantage of this process is that the CCD electrodes, the conductive transistor gate, and the transistor source and drain regions, are all formed during the same single diffusion operation.

The frequency response of a CCD structure is very often limited by the response of its output transistor. My process makes possible the fabrication of output self-aligned gate field effect transistors fabricated on the same substrate with the main body of the CCD and during the same processing steps. This can be done regardless of whether the CCD electrodes are self aligned. For example, my invention can be practiced by building a CCD with two sets of polycrystalline electrodes and a self-aligned MOS output transistor all in a single semiconductor body during the same processing steps. If the CCD electrodes are not self aligned, then the first set of electrodes should be fabricated using doped polycrystalline silicon and the second set using either doped or undoped polycrystalline silicon. This is because the electrodes of the second set and parts of the electrodes of the first set will be doped again during the formation of the source and drain regions of the output transistor.

A structure may be constructed in accordance with this invention where instead of diffusion, ion implantation may be used for the doping of the gate electrodes and the formation of the source and drain regions.

Using this invention, both N-channel and P-channel structures can be constructed with good high frequency response and low noise. Although most discussion in this specification focuses around the P-channel CCD structures, the same principles apply to the fabrication of both P- and N-type structures. Similarly, while most discussion focuses around silicon devices using polycrystalline silicon gates, there is nothing to limit the invention to this combination of materials.

Accordingly, it is an object of the present invention to provide a new and highly reproducible process for the fabrication of a charge coupled device and its output transistors.

Another object is to provide a novel method for fabricating a charge coupled device and its input and output structures on the same semiconductor body using the same processing steps.

Another object of this invention is to provide a method for making a self-aligned CCD and a self-aligned MOS transistor where the CCD electrodes, the transistor gate electrodes and the transistor source and drain regions are all formed during the same impurity doping operations.

Another object of this invention is to provide a new CCD/MOS transistor structure having an improved frequency response and an improved signal-to-noise ratio.

These and other objects of the invention will become apparent in the following description taken in conjunction with the accompanying drawings.

DRAWINGS

FIGS. 4a through 4f illustrate, in a series of diagrammatic cross-sectional views, a sequence of some of the most important process steps utilized in fabricating a CCD/MOS structure in accordance with the present invention; and FIGS. 5a through 5e illustrate, in a series of cross-sectional views, a sequence of alternate steps utilized in fabricating a CCD/MOS structure in accordance with the present invention.

DETAILED DESCRIPTION

Figure 1:
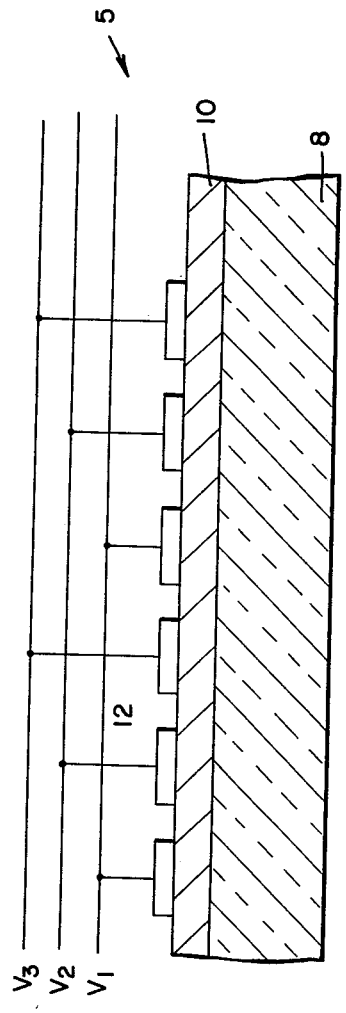
FIG. 1 shows a cross-sectional view of a portion of a prior art CCD structure.

Referring now to FIG. 1, there is shown a portion of a prior art CCD, generally designated 5. The structure includes a semiconductor substrate 8, a dielectric layer 10, and a set of metal electrodes 12. Every third electrode is connected to a common conductor which makes this structure a three-phase device. Such a device was described by W. S. Boyle and D. E. Smith in an article published in the Bell Systems Technical Journal of April 1970, on pages 587–593, inclusive. The three sets of electrodes are formed from a single layer of metal which is etched to form a set of narrow interelectrode gaps. The major limitations of such a structure are associated with the quality and size of these gaps. The gaps must be as small as possible, so that the potential wells can couple efficiently. However, it is difficult to sufficiently reduce their size and at the same time be able to maintain an acceptable processing yield.

Figure 2:
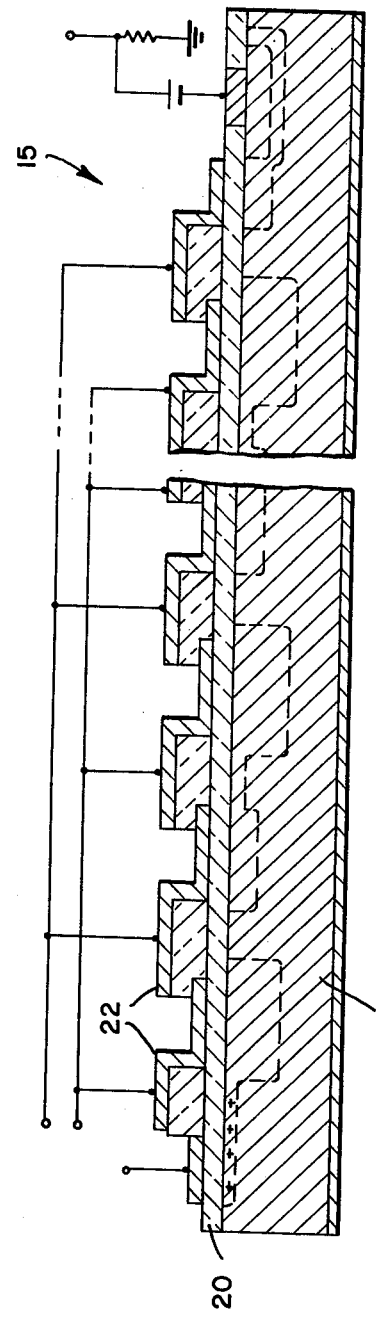
FIG. 2 shows a cross-sectional view of another prior art CCD structure.

Referring now to FIG. 2, there is shown a portion of a prior art CCD, generally designated 15. The structure includes a semiconductor substrate 18, a dielectric layer 20, and a set of electrodes 22. This is a two-phase device, so every other electrode is connected to the same conductor. Such a device is described in more detail in U.S. Pat. No. 3,651,349 of D. Kahng et al. One limitation of this structure is due to the high coupling capacitance genterateed by the overlap of adjacent electrodes. This becomes more important at high operating frequencies.

Figure 3:
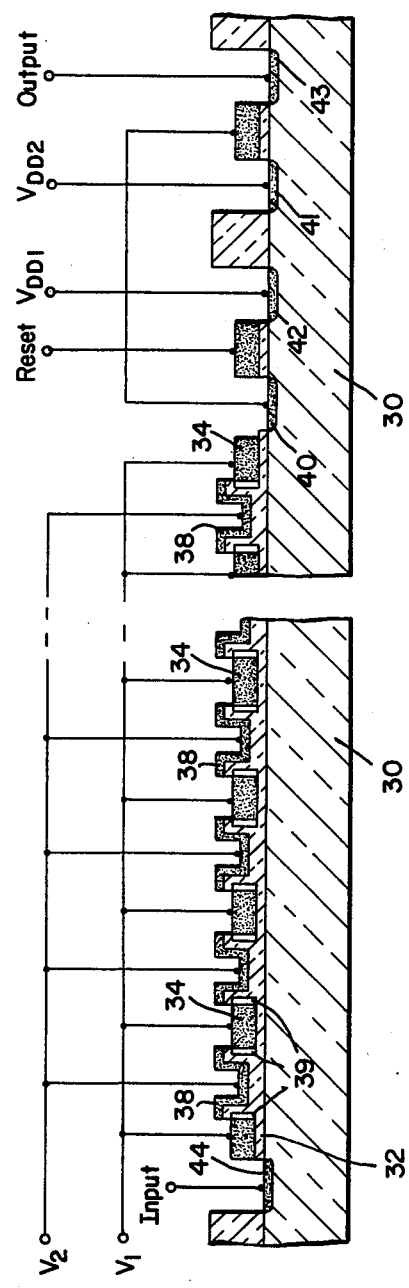
FIG. 3 is a sectional view of the CCD/MOS structure fabricated in accordance with the present invention.

Referring now to FIG. 3, there is shown a cross-sectional view of a monolithic integrated CCD/MOS structure constructed in accordance with the present invention. It includes an input diode, an array of CCD cells, and two output MOS transistors, all fabricated on a single substrate during the same processing steps. The CCD cells are constructed with two sets of self-aligned electrodes wired for a two-phase operation. The same structure may also be wired for a four-phase operation. The output structure contains two self-aligned insulated gate field effect transistors. Although the structure shown in FIG. 3 was fabricated on an N-type silicon substrate, the invention is not limited to N-type silicon or to devices built in silicon. This is just one example of a structure fabricated using the present invention. It comprises an N-type silicon substrate 30, having a typical resistivity on the order of 3 ohm-centimeters. On the top of this substrate there is a layer of silicon dioxide 32, insulating the substrate from two sets of polycrystalline silicone electrodes (referred to as polysilicon electrodes). A first set 34 is within approximately 1,000 Å from the substrate and a second set 38 is within approximately 3,000 Å from the substrate. The electrodes of the second set partially overlap the electrodes of the first. The two sets are insulated from each other by a layer of $SiO_2$ 36. In addition, the parts 39 of the electrodes of the first set that are covered by the electrodes of the second set are not conductive, so that the effective electrodes of the two sets are in perfect alignment with each other, thus keeping the coupling capacitances between the upper and lower electrodes to a minimum.

The function of the two transistors at the end of the structure is to process the output signals. Each one uses a gate electrode belonging to the first set of polysilicon electrodes and insulated from the substrate by the same layer of $SiO_2$ that insulates the other electrodes of the first set. The source regions 40 and 41 for the reset and output transistors, respectively, and drain regions 42 and 43 for the reset and output transistors, respectively, are made P+ during the doping of the two sets of electrodes and using the same electrodes as diffusion masks.

The P+ region 44 of the input diode is also formed during the same diffusion operation used for the formation of the P+ regions of the transistors.

Figure 4A:
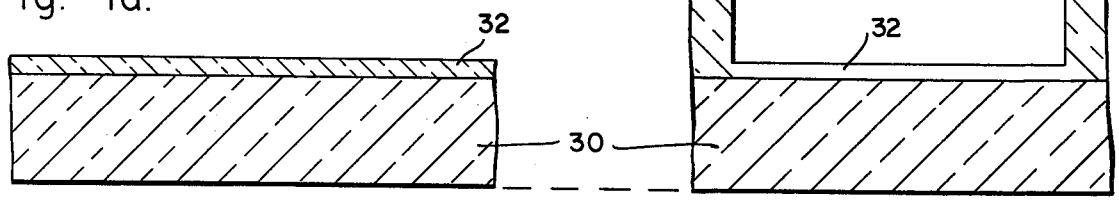

Referring now to FIGS. 4a through 4f, there is shown, in a series of cross-sectional views, a sequence of some of the most important process steps which may be utilized to fabricate a CCD/MOS structure in accordance with the present invention. In FIG. 4a there is shown a semiconductor substrate 30, which may be N-type silicon on which a first dielectric layer 32 is formed. Typically, when the semiconductor substrate is silicon, the dielectric layer is a layer of silicon dioxide ($SiO_2$) grown through the thermal oxidation of silicon and having a thickness on the order of 1,000 Å. On the top of the first dielectric layer a first semi-insulating semiconductor layer, such as undoped polycrystalline silicon (referred to as undoped polysilicon) is deposited. The thickness of this layer is, for example, on the order of 5,000 Å. Through conventional masking techniques, a gate electrode pattern is formed on the polysilicon layer, and through etching a first set of semiconductor strips is formed.

Figure 4B:
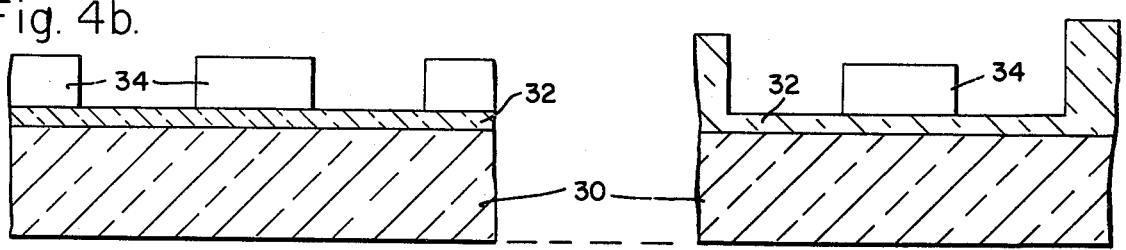

In FIG. 4b there is shown a set of polysilicon strips 34, formed adjacent to a first $SiO_2$ layer. These strips will be used to make the first set of CCD electrodes and the gate electrodes of the output MOS transistors.

Figure 4C:
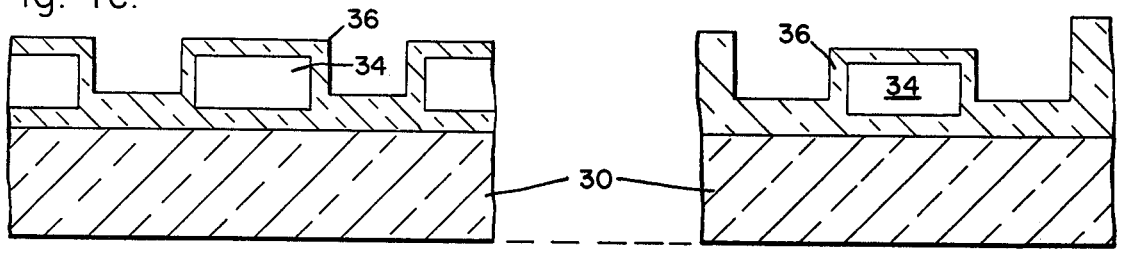

In FIG. 4c there is shown the processed structure after the formation of a second dielectric layer 36 on the top of the semiconductor strips and parts of the first dielectric layer. When the strips are made of polysilicon, the second dielectric layer may be silicon dioxide formed by the oxidation of the polysilicon and the further oxidation of parts of the silicon substrate that are not covered by the polysilicon strips. On the top of the second dielectric layer, a second semi-insulating semiconductor layer, such as undoped polycrystalline silicon, is deposited. The thickness of this layer is, for example, on the order of 4,000 Å. Through conventional masking techniques a new gate electrode pattern is formed on the second semi-insulating layer, and through etching a second set of semiconductor strips is formed.

Figure 4D:
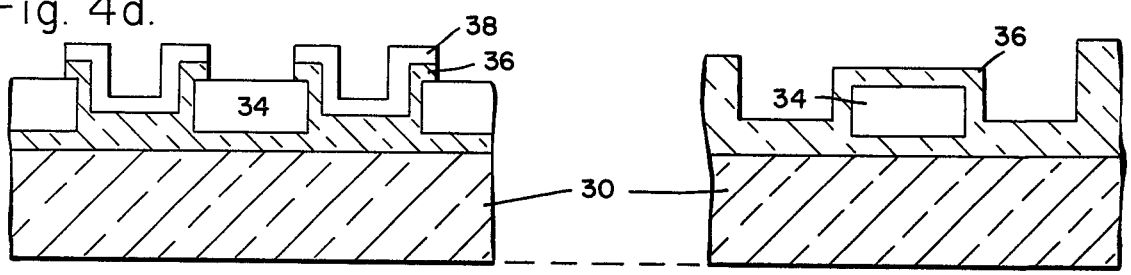

In FIG. 4d there is shown this second set of strips 38. The strips of the second set are spatially disposed over the intermediate areas between the strips of the first set and partially overlap these strips. However, the strips of the two sets are electrically insulated from each other and from the semiconductor substrate by the first and second dielectric layers.

Figure 4E:
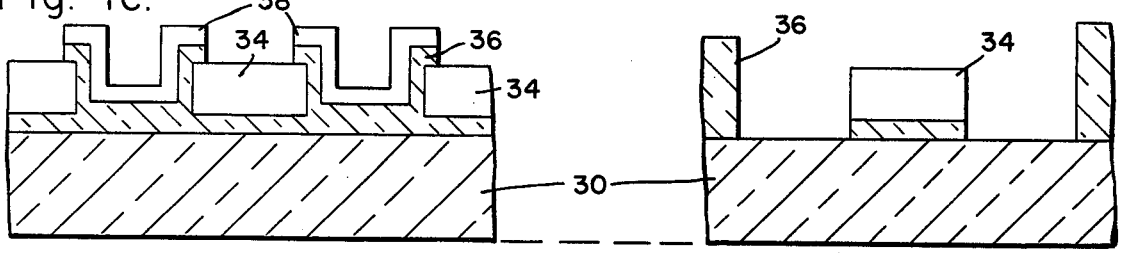
Figure 4F:
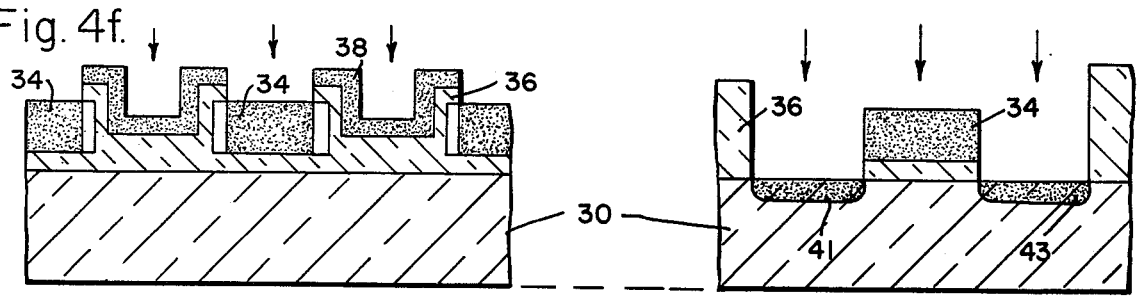

In FIG. 4e there is shown the processed structure after the exposed parts of the dielectric layers have been removed. This exposes the top surfaces of the strips of the second set 38 and parts of the strips of the first set 34, and predetermined parts of the substrate for the source and drain regions of the output transistors.

The next step is to form the source and drain regions of the output transistor and the gate electrodes by diffusing a conductivity determining impurity different from the conductivity type of the substrate, into the exposed parts of the substrate and the exposed parts of the semiconductor strips. If the substrate is N-type, then a P-type impurity, such as boron, may be diffused in sufficient quantities to make the resistivity of the strips 50–100 ohms per square. The semiconductor strips are used as diffusion masks. Parts of the strips of the first set are left undoped, and therefore nonconducting, while the other parts are in perfect alignment with the strips of the second set, thus assuring an optimum coupling for the potential wells and a minimum of coupling capacitance and noise. Similarly, since the gate electrode of the output transistor was used as a diffusion mask, it is perfectly aligned to the source and drain regions.

Figure 5A:
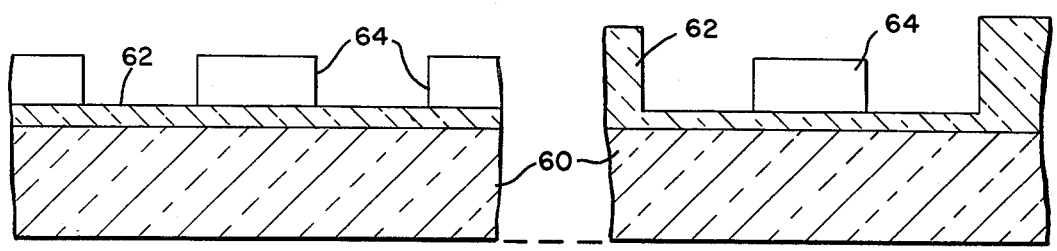
Figure 5B:
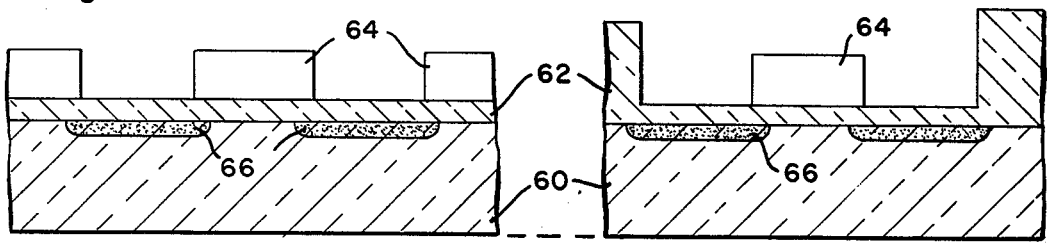
Figure 5C:
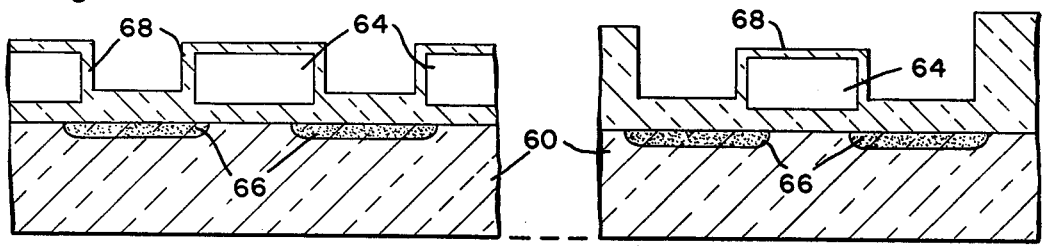
Figure 5D:
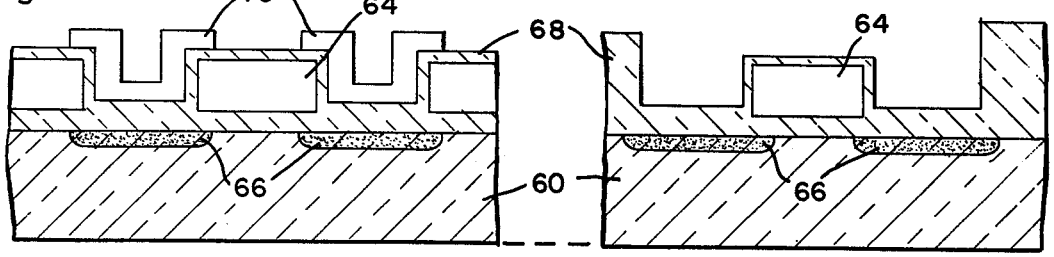
Figure 5E:
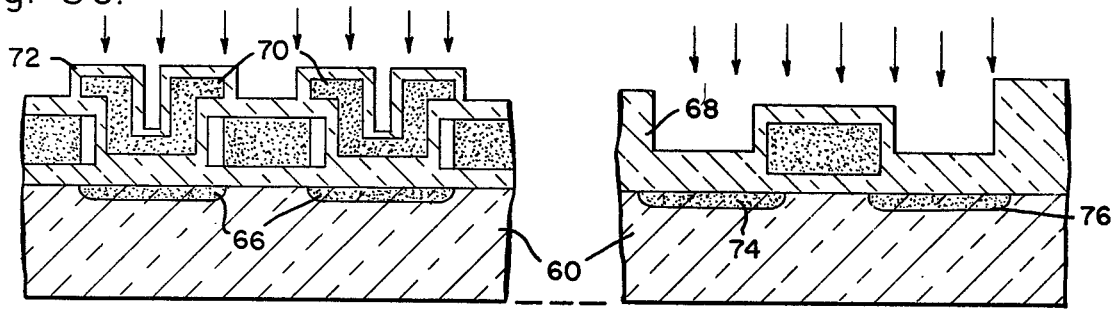

Referring now to FIGS. 5a through 5e, there is shown, in a series of cross-sectional views, an alternate sequence of process steps utilized in fabricating a CCD/MOS structure in accordance with the present invention. The main difference between these process steps and the ones described before is in the method of introducing impurities for the formation of the gate electrodes of the whole structure and the source and drain regions of the transistors. In the process steps shown by FIGS. 5a through 5e, ion implantation is used instead of diffusion. In FIG. 5a there is shown a semiconductor substrate 60, such as, for example, an N-type silicon substrate with a resistivity on the order of 3 ohm-centimeters, on which a first dielectric layer 62 is formed. Typically, when a semiconductor substrate is silicon, the dielectric layer is silicon dioxide, grown thermally and having a thickness on the order of 1,000 Å. On the top of the first dielectric layer 62, a first semi-insulating semiconductor layer, such as undoped polysilicon, is deposited. The thickness of this layer is on the order of 5,000 Å. Through conventional masking techniques a gate electrode pattern is formed on the polysilicon layer, and through etching a first set of polysilicon strips 64 is formed. Using the polysilicon strips as an ion implantation mask, N-type ions, such as phosphorous ions, are implanted into the substrate. The concentration of these ions is on the order of $10^{12}$ atoms/cm². The resultant impurity concentration of these implanted regions is higher than the original impurity concentration of the substrate. This forms shallow $N^-$ regions 66 in the implanted areas of the substrate as shown in FIG. 5b. The reason for forming these $N^-$ regions is in order to shift the threshold under the second polysilicon layer to be formed. The structure is then oxidized again in a dry oxygen ambient to achieve a second silicon dioxide layer 68, as shown in FIG. 5c. In FIG. 5d there is shown the same structure after the formation of the second set of polysilicon strips 70. The strips of the second set fill the area between the strips of the first set and partially overlap them. In FIG. 5e there is shown the same structure after the growing of a new $SiO_2$ layer 72. The purpose of this layer is to facilitate the ion implantation step to follow. The thickness of the $SiO_2$ layer over the strips of the second set is on the order of 1,000 Å, while the combined thickness of the two $SiO_2$ layers on the top of the strips of the first set and over the predetermined source and drain regions of the output structure is on the order of 2,000 Å or less.

The next step is to plant into the strips and the substrate, ions of a different conductivity type to that of the substrate. For the N-type substrate of our example, ions of a P-type impurity, such as boron, may be used for this purpose. The polysilicon strips are used as implantation masks to assure the formation of two perfectly aligned sets of CCD electrodes and for the output structure the formation of source and drain regions 74 and 76, respectively, perfectly aligned to the gate electrodes. The ion concentration (on the order of $10^{15}$ atoms/cm²) during this implantation is sufficiently heavy to overcompensate the $N^-$ dopants previously implanted in the source and drain regions, and transform these same regions into P+ type regions.

While the invention has been described in connection with a preferred sequence of process steps used to fabricate a basic CCD/MOS structure, it will be understood that the invention is not to be limited to those particular process steps, their sequence, or the final structures depicted in the drawings. On the contrary, it is intended to cover all alternatives, modifications and equivalents, as may be included within the spirit and scope of the invention as defined in the appended claims.

What is claimed is:

1. A method of fabricating a semiconductor charge coupled device structure comprising the steps of:
   (a) forming a first layer of electrically insulating material on a portion of a surface of a semiconductor substrate of a first type of conductivity;
   (b) disposing a first layer of a semi-insulating semiconductor material on predetermined portions of said first layer of electrically insulating material to form a first set of semiconductor strips with predetermined spaces between adjacent strips exposing portions of said first insulating layer;
   (c) forming a second layer of electrically insulating material on said first set of semiconductor strips and on said exposed portions of said first insulating layer;
   (d) disposing a second layer of a semiconductor material on selective predetermined portions of said second layer of electrically insulating material to form a second set of semiconductor strips which overlie said spaces between said adjoining strips of said first set of semiconductor strips and partially overlie said strips of said first set;
   (e) removing portions of electrically insulating material to expose portions of said first set of strips lying under and between said strips of said second set of strips and to expose predetermined portions of said semiconductor substrate; and
   (f) introducing conductivity type determining impurities into both said first set of strips and the exposed substrate to convert the conductivity thereof to a second type of conductivity.

2. A method as set forth in claim 1 wherein:
   (a) said semiconductor substrate is silicon;
   (b) said first and second insulating layers are silicon dioxide;
   (c) said first and second semiconductor layers are undoped polycrystalline silicon.

3. A method as set forth in claim 1 wherein:
   (a) said semiconductor substrate is silicon;
   (b) said first and second insulating layers are silicon dioxide;
   (c) said first layer of semiconductor material is doped polycrystalline silicon;
   (d) said second layer of semiconductor material is undoped polycrystalline silicon.

4. A method of fabricating a semi-conductor CCD/MOS-transistor combination comprising the steps of:
   (a) forming a first layer of silicon dioxide on a surface of a silicon body of a first type of conductivity;
   (b) disposing a first layer of semi-insulating polycrystalline silicon on predetermined portions of said first layer of silicon dioxide;
   (c) forming a second layer of silicon dioxide on top of said first polycrystalline silicon layer;
   (d) disposing a second layer of polycrystalline silicon on top of predetermined sections of said second layer of silicon dioxide;
   (e) removing exposed portions of said first layer and said second layer of silicon dioxide to expose portions of said first and said second silicon layers and portions of said silicon body; and
   (f) diffusing into said exposed polycrystalline silicon and exposed silicon body surfaces a conductivity type determining impurity capable of converting said materials into a second type of conductivity, thereby using said second layer of polycrystalline silicon as a diffusion mask to determine the lateral extent of impurity diffusion into said first layer of polycrystalline silicon and using a predetermined polycrystalline silicon portion as a diffusion mask to determine the lateral extent of impurity diffusion into adjoining exposed portions of said silicon body.

5. A method of fabricating a CCD structure comprising the steps of:
   (a) forming a first layer of electrically insulating material on a surface of a semiconductor substrate of a first type conductivity;
   (b) forming a layer of a semi-insulating semiconductor material on top of said first layer of electrically insulating material;
   (c) etching away portions of said first layer of semiconductor material to form a first set of strips of semiconductor material therein for a set of electrodes to be formed for both said CCD structure and said output field effect transistor and exposed portions of said first layer of electrically insulating material between said strips of semiconductor material;
   (d) forming a second layer of electrically insulating material on top of said semiconductor strips and on top of exposed portions of said first layer of electrically insulating material;
   (e) forming a second layer of semiconductor material on top of said second layer of electrically insulating material;
   (f) etching away portions of said second layer of semiconductor material to form a second set of strips of semiconductor material wherein each strip is intermediate and partially overlapping two adjoining strips of said first set of strips of semiconductor material therein for another set of electrodes to be formed for said CCD structure;
   (g) etching away exposed portions of insulating material exposing portions of said first set of strips of semiconductor material not overlapped by said second set of strips of semiconductor material and portions of said semiconductor substrate; and
   (h) diffusing into said second set of strips and exposed parts of said first set of strips and into said exposed portions of said substrate a conductivity type determining impurity capable of establishing into said strips and portions of said substrate the opposite type of conductivity to said first type of conductivity whereby producing two sets of electrodes partially overlapping each other and separated from each other and from said substrate by layers of electrically insulating material and establishing transistor source and drain regions in said substrate and on either side of an electrode belonging to one of said two sets of electrodes whereby forming an output transistor at the end of a CCD structure.

6. A method of fabricating a semiconductor charge coupled device and its output field effect transistor comprising the steps of:
(a) forming a first layer of electrically insulating material on a portion of a surface of a semiconductor substrate of a first type of conductivity;
(b) disposing a first layer of a semiconductor material on predetermined portions of a surface of said first layer of electrically insulating material;
(c) implanting into portions of said substrate a conductivity determining impurity of a first type of conductivity and in a relatively low concentration using said first layer of semiconductivity material as an implantation mask;
(d) forming a second layer of electrically insulating material on said first layer of semiconductor material;
(e) disposing a second layer of a semiconductor material on selective predetermined portions of said second layer of electrically insulating material;
(f) forming a third and relatively thin layer of electrically insulating material on said second layer of semiconductor material; and
(g) implanting into said first and second semiconductor layers and said portions of said semiconductor substrate, using said first and second semiconductor layers as an implantation mask, ions of a conductivity type determining impurity and in a relatively high concentration capable of forming into said materials a second type of conductivity.

7. A method of fabricating a semiconductor CCD/MOS transistor combination comprising the steps of
(a) forming a first layer of silicon dioxide on a surface of a semi-insulating silicon body of a first type of conductivity;
(b) disposing a first layer of polycrystalline silicon on predetermined portions of said layer of silicon dioxide;
(c) implanting into portions of said substrate a conductivity determining impurity of a first type of conductivity and in the order of $10^{12}$ atoms/cm$^2$ using said first layer of polycrystalline silicon as an implantation mask;
(d) forming a second layer of silicon dioxide on said first layer of polycrystalline silicon;
(e) disposing a second layer of polycrystalline silicon on selective predetermined portions of said second layer of silicon dioxide;
(f) forming a third and relatively thin layer of silicon dioxide on said second layer of polycrystalline silicon;
(g) implanting into said first and second polycrystalline silicon layers and said portions of said semiconductor substrate, using said first and second polycrystalline silicon layers as an implantation mask, ions of a conductivity type determining impurity capable of forming into said materials a second type of conductivity.

8. A method of forming charge transfer structures with vertically spaced aligned electrodes with negligible or no overlap capacitance atop a semiconductor substrate comprising the steps of:
(a) forming a first layer of insulating material on a surface of said substrate;
(b) forming a first plurality of device electrode members at selectively spaced locations on said first layer of insulating material;
(c) forming a second layer of insulating material atop said first layer of insulating material and between said first plurality of device electrode members and having openings therein aligned with chosen areas, respectively, of said first plurality of device electrode members;
(d) forming a second plurality of device electrode members between said first plurality of electrode members and atop said second layer of insulating material, with spacings therebetween aligned with said openings in said second insulating layer; and
(e) simultaneously introducing conductivity type determining impurities into both said first and second plurality of electrode members to dope and control the conductivity thereof, whereby said second plurality of electrode members serves as an impurity mask for portions of said first plurality of electrode members, and the doped portions of both said first and second plurality of electrode members are both self-aligned and continuous atop the surface of said semiconductor substrate.

9. The method defined in claim 8 wherein said first and second pluralities of device electrode members are completed by doping polycrystalline silicon with selected P or N type impurities.

10. The method defined in claim 8 wherein said openings in said second insulating layer and said spacings between said second plurality of device electrode members are formed in a single masking and etching step.

11. The method defined in claim 8 wherein said first and second pluralities of device electrode members are completed by doping polycrystalline silicon with selected P or N type impurities.

12. The method defined in claim 11 wherein vertically displaced charged coupled device structures are made by disposing said adjacent first and second plurality of device electrode members at different and alternating vertical distances above said surface of said semiconductor substrate.

* * * * *